United States Patent [19]

Maher et al.

[11] 4,230,754
[45] Oct. 28, 1980

[54] BONDING ELECTRONIC COMPONENT TO MOLDED PACKAGE

[75] Inventors: John P. Maher, Adams, Mass.; Elsa Kam-Lum, Amherst, N.H.

[73] Assignee: Sprague Electric Company, North Adams, Mass.

[21] Appl. No.: 958,598

[22] Filed: Nov. 7, 1978

[51] Int. Cl.² .................. H01L 23/28; B32B 27/38
[52] U.S. Cl. .................. 428/76; 174/52 PE; 357/72; 264/272; 264/135; 428/391; 428/417; 428/447; 428/450; 428/413
[58] Field of Search .............. 428/391, 387, 417, 447, 428/450, 413, 76; 264/272, 135; 174/52 PE; 357/72; 427/118, 96, 58

[56] References Cited

U.S. PATENT DOCUMENTS

| 2,946,701 | 7/1960 | Plueddemann | 428/391 |
|---|---|---|---|
| 3,652,333 | 3/1972 | Warren | 264/272 |
| 3,749,601 | 7/1973 | Tittle | 264/272 |
| 3,772,079 | 11/1973 | Louzon | 174/52PE |
| 3,788,895 | 1/1974 | Schimmer | 427/93 |
| 3,824,328 | 7/1974 | Ting | 174/52 PE |
| 3,849,187 | 11/1974 | Fetscher | 264/272 |
| 3,911,475 | 10/1975 | Szedon | 357/72 |
| 3,915,780 | 10/1975 | Broussard | 264/272 |
| 3,946,427 | 3/1976 | Iwasawa | 357/72 |
| 4,048,356 | 9/1977 | Bakos | 428/447 |

OTHER PUBLICATIONS

"Silane Coupling Agents", *Dow Corning Corporation*, 1970 p. 29–31.

*Primary Examiner*—Ellis P. Robinson
*Attorney, Agent, or Firm*—Connolly and Hutz

[57] ABSTRACT

An electronic component with leads attached is cleaned, a layer of an epoxy or epoxy-reactive silane is applied and cured, and then the package material is molded on. The silane layer bonds the component to the package and provides a fluid-tight seal therebetween. The silane is gamma-glycidoxypropyl- or gamma-aminopropyltrimethoxy or triethoxy silane.

2 Claims, 1 Drawing Figure

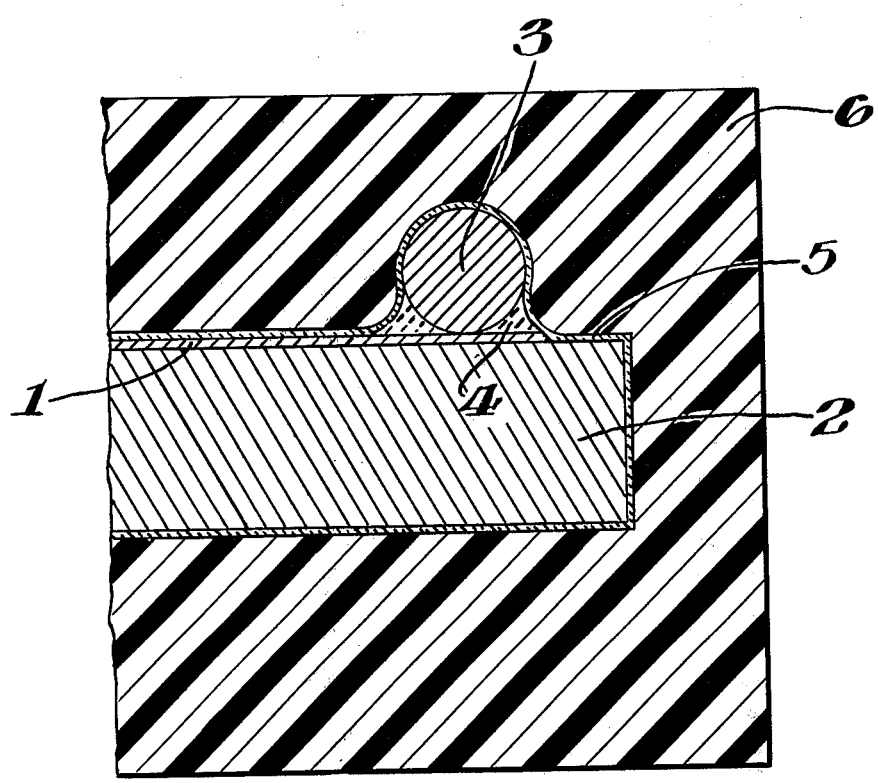

BONDING ELECTRONIC COMPONENT TO MOLDED PACKAGE

BACKGROUND OF THE INVENTION

The invention relates to the bonding of an electronic component to its molded package to render the package fluid-tight.

While various types of protective coatings for electronic components have been known and used for various reasons for a long time, it is only recently because of changes in technology and materials that it has become critical to seal completely these units against fluid penetration.

In the past, protective resilient coatings have found utility in providing stress and shock relief for components mounted in hollow shells. Resilient coatings have been used also with potted units to provide protection from vibration, thermal shock, and contamination (including moisture) and from the potting or encapsulating compositions.

Protective precoats have been used with electronic components because of differences in thermal expansion between the units and molded cases and to prevent contamination of the units by encapsulating materials.

As fully molded units became more popular, the seal between the leads or pins became more of a problem as the molding materials contain mold release agents to facilitate removal of the units from the molds. Unfortunately, these agents also prevent good adhesion to the metal leads or pins.

As water-soluble fluxes are replacing rosin fluxes in the reflow soldering of these units to circuit boards, because of environmental concerns, the sealing of the leads or pins to the covers or cases has become even more critical as these water-soluble materials are much higher in ionic material than prior rosin-based fluxes and eventually cause internal contamination and corrosion leading to failure of the unit. Thus, a need has arisen to find sealant materials which are compatible with the materials already in use in molded components and yet resist penetration by fluxes and ionic contaminants. One such solution to the above problem, described in copending application Ser. No. 863,545 filed Dec. 22, 1977, is to fill in the space between the unit (including leads) and the case with a sealant layer.

SUMMARY OF THE INVENTION

In order to prevent ingress into a fully-molded electronic component by aqueous fluxes and ionic contaminants, a layer is provided to bond the unit to the case molded around it. This layer is preferably monomolecular, although in actual production it may be thicker, and bonds the unit and a portion of the leads and the cover resulting in no space therebetween.

The bond prevents space from developing between the component and cover as the leads are bent and flexed during processing and testing after encapsulation and during installation. When spaces did develop in the prior art, flux could creep along the leads and cause failure 2-3 months later.

The bond of this invention is provided by an epoxy-reactive silane applied as a solution, preferably by dipping. Trimethoxy- and triethoxy-silane compounds are preferred for solubility reasons; these groups are hydrolyzed in solution producing the corresponding alcohols and leaving—SiOH—which bonds to the component, frequently an alumina ceramic. On curing, the OH portion of the above is removed, leaving a Si—surface bond. The other end of the molecule must react with epoxy encapsulant and for this reason, an epoxy, gamma-glycidoxypropyl, or epoxy-reactive, gamma-aminopropyl, compound is preferred.

The bonding is accomplished by applying a thin layer of the epoxy-reactive silane, i.e., gamma-glycidoxypropyl- or gamma-aminopropyl- trimethoxy or triethoxy silane to a clean unit and to that portion of the leads adjacent the unit, curing the layer, and then molding the case around the unit. Since the case materials are preferably epoxy resins, the epoxy portion of the bonding material bonds to it while the silane bonds to the unit and leads. A fluid-tight molded unit is thus obtained.

BRIEF DESCRIPTION OF THE DRAWING

The sole FIGURE shows a thick film component bonded via a silane layer to a molded epoxy package. Thick film component 1 on a substrate 2, typically alumina, to which lead wires 3 (of which only one is shown), have been attached by solder 4 is covered by the epoxy or epoxy-reactive silane bonding layer 5 that, in turn, bonds the latter to the molded epoxy package 6. The thickness of the silane layer is exaggerated.

DESCRIPTION OF THE PREFERRED EMBODIMENT

Electronic components such as resistor-capacitor networks or thick film resistor networks with attached leads are cleaned by known methods, e.g., water washed, and then dipped into a bath of gamma-glycidoxypropyl or gamma-aminopropyl trimethoxy or triethoxy silane to apply at least a monomolecular layer. The layer is cured by heating the units in an oven, e.g., at 110° C. for 30 min. After curing, the units are placed in molds, and the cases are molded around the units and bonded to them via the silane.

The following examples show the resistance to fluid penetration resulting from the practice of the present invention. In order to test penetration, fluorescent dye was added to a typical water-soluble glycol-based flux. The test involved submerging units, lead side up, in the flux at 70° C. for 4 min. and then rinsing the units twice with isopropanol. The non-lead edges of the cases were dry ground off, the cases were cracked open, and the units were examined under ultraviolet light for fluorescence, indicating penetration.

In the table below, penetration results are expressed as a fraction with the numerator indicating the number of leads penetrated and the denominator indicating the total number of leads. The transfer molding epoxy materials used on the test units are a 40-50% glass or mineral-filled epoxy (A) and a 60-70% glass or mineral-filled epoxidized Novalak resin (N), which have a molding temperature of 300°-350° F. The test units are 4-lead units manufactured with and without the bonding layer.

| Data | Penetration |
|---|---|
| No bonding layer | 7/40 |
| A | |
| With bonding layer | 0/76 |
| No bonding layer | 25/64 |
| N | |
| With bonding layer | 6/64 |

Thus, the bonding layer prevented or significantly reduced penetration by water-soluble fluxes.

What is claimed is:

1. In the manufacture of a fully-molded electronic component having leads attached thereto, the steps of: applying a thin seal layer of an epoxy-reactive silane directly onto said component including that portion of said attached leads adjacent said component, then curing said layer to co-react said silane with said component and leads and form said seal, then subjecting said component with attached leads and said seal to a transfer molding operation to surround said component and said portion of attached leads in an epoxy package, said silane being chosen from the group consisting of gamma-aminopropyl trimethoxy silane, gamma-aminopropyl triethoxy silane, gamma-glycidoxypropyl trimethoxy silane, and gamma-glycidoxypropyl triethoxy silane and bonding said sealed component and leads to said epoxy package by reaction during said transfer molding operation.

2. A molded electronic component comprising an electronic network on a substrate with lead wires forming a unit, a sealing layer of epoxy silane or epoxy-reactive silane surrounding said unit and bonded thereto, and a molded epoxy package surrounding said unit and layer and bonded to said unit via said layer wherein said layer is cured prior to molding said epoxy package.

* * * * *